United States Patent
Bardos

[11] 3,964,032
[45] June 15, 1976

[54] OPTICAL SYSTEM FOR STORING INFORMATION

[75] Inventor: Andrew M. Bardos, Indian Harbour Beach, Fla.

[73] Assignee: Harris Corporation, Cleveland, Ohio

[22] Filed: Nov. 27, 1974

[21] Appl. No.: 527,618

Related U.S. Application Data

[62] Division of Ser. No. 452,071, March 18, 1974.

[52] U.S. Cl............................. 340/173 LM; 350/3.5
[51] Int. Cl.²................. G11C 13/04; G11C 11/44
[58] Field of Search............... 340/173 LM; 350/3.5

[56] References Cited
UNITED STATES PATENTS

| | | | |
|---|---|---|---|
| 3,531,184 | 9/1970 | Adler | 350/161 |
| 3,799,652 | 3/1974 | Torguet | 350/161 |

*Primary Examiner*—Terrell W. Fears

[57] ABSTRACT

A wideband holographic information storage system records Fourier holograms on film in rapid succession, each hologram storing 128 bits of data. The hologram fringe pattern is held stationary by varying the reference beam frequency to track the variations of frequency of the signal beam that are caused by acousto-optic modulation of the signal beam. Holograms are successively recorded in adjacent positions by scanning a light beam across a photosensitive film with a rotating polygonal mirror, the recording light beam being wide enough to cover two facets of the mirror so as to achieve nearly 100% scanning duty cycle. During readout, a readout light beam is steered to compensate for prismatic deflection effects caused by variations in thickness of the film. The direction of the output beam is maintained constant despite a scanning motion of the incident readout beam, by reflecting the output beam a second time from a different facet of the polygonal mirror to compensate the rotational component of beam motion. Clocking of output data is self-synchronized, based upon modulation signals. Acoustically caused defocusing of the light beam is optically corrected. Methods are employed to reduce crosstalk.

24 Claims, 14 Drawing Figures

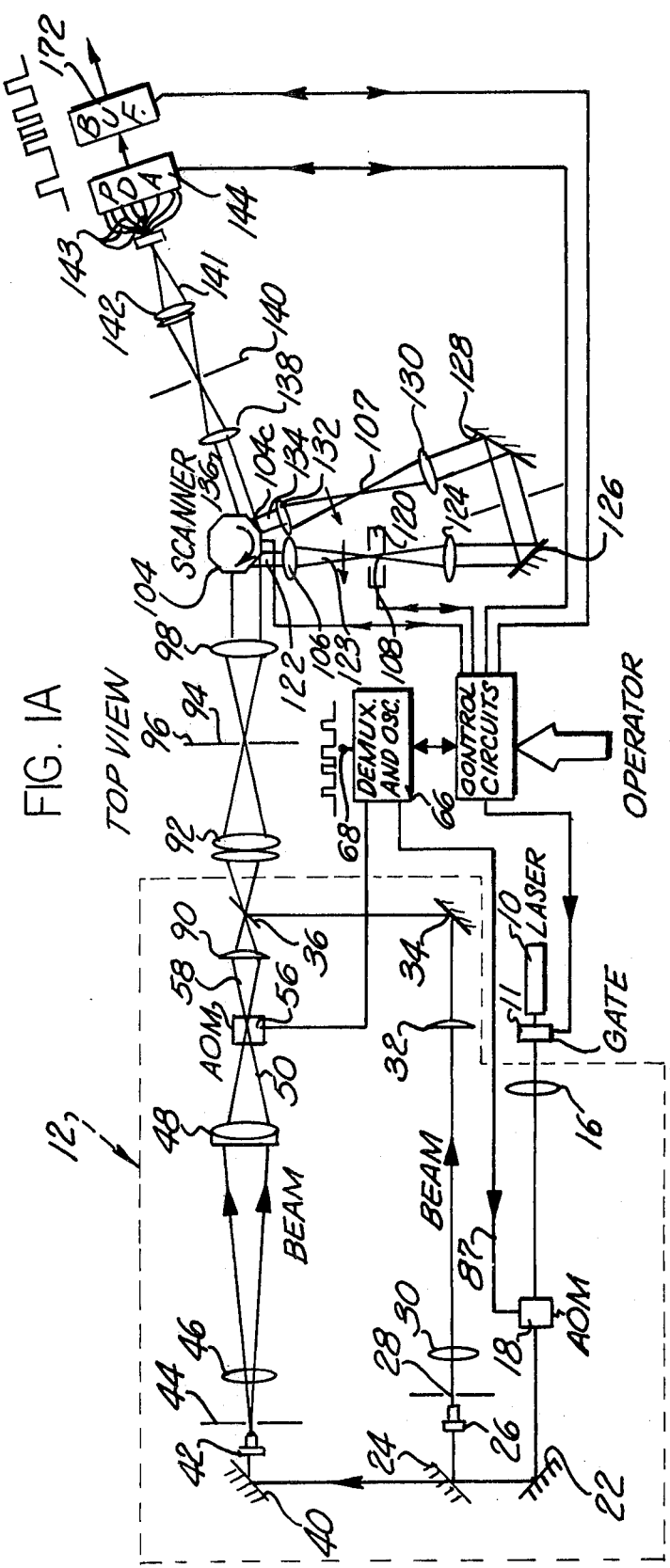

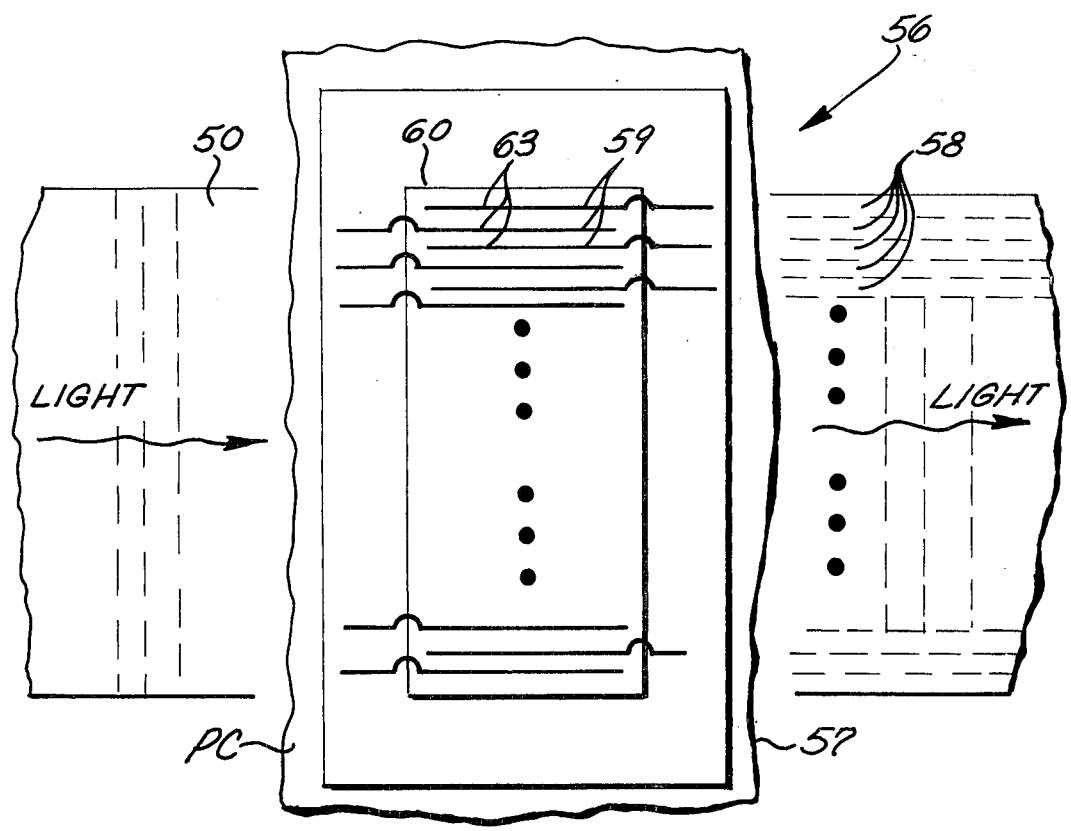
FIG. 2A
FIG. 2B
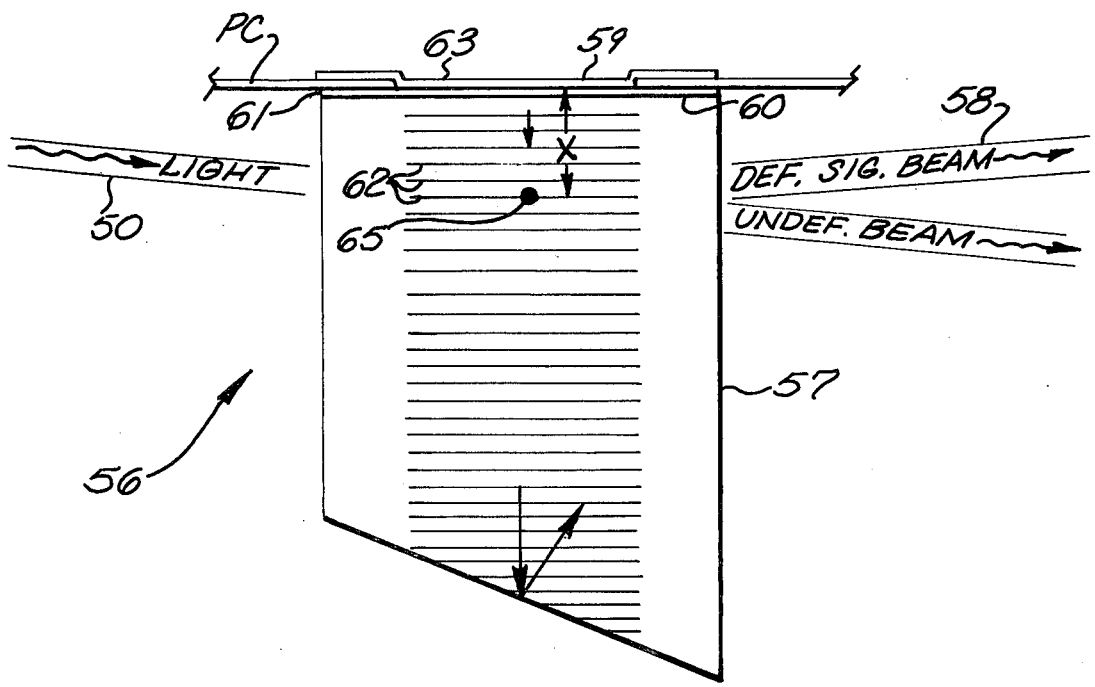

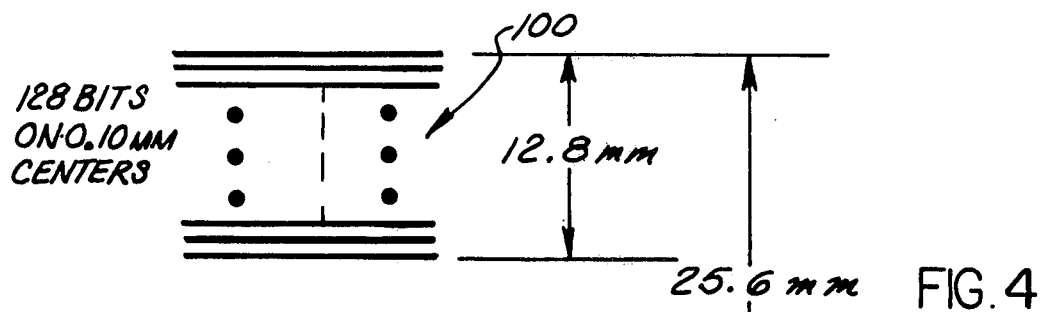
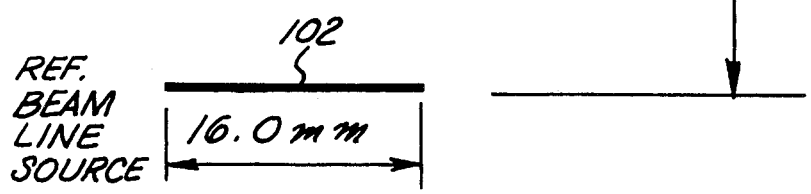
FIG. 4
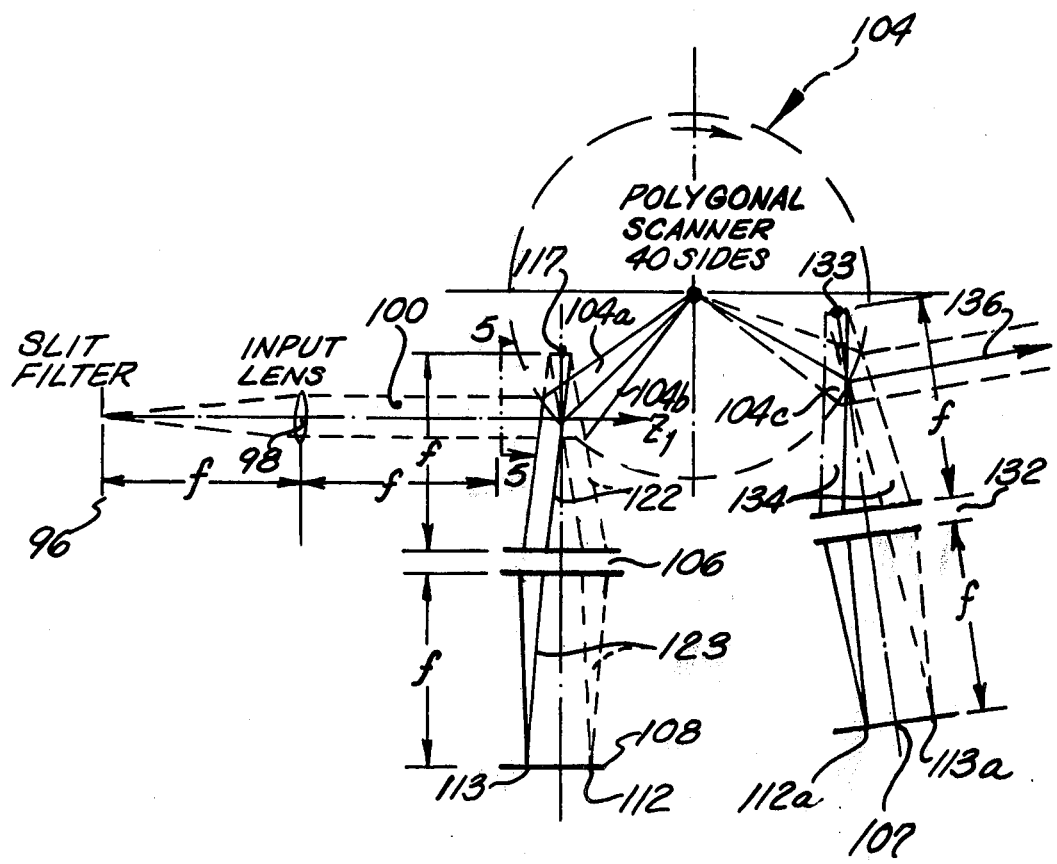
FIG. 5

OPTICAL SYSTEM FOR STORING INFORMATION

This is a division of application Ser. No. 452,071, filed Mar. 18, 1974, by joint inventors Adam Kozma, Anthony VanderLugt, and Andrew M. Bardos, entitled "Optical Information Storage System", the present divisional application being made by sole inventor Andrew M. Bardos.

BACKGROUND OF THE INVENTION

The present invention relates to recording of information and in particular to simultaneous recording of a plurality of data digits in the form of a single hologram, followed in rapid succession by similar recordings of additional holograms each of which also represents a plurality of data digits.

In the prior art, lineal arrays and page arrays of binary data were recorded on light sensitive film in the form of Fourier holograms of the arrays of data, and rotating polygonal mirrors have been used for scanning the recording film with light during recording and readout to address various hologram locations on the film During recording, the fringe patterns of the holograms have moved somewhat because of variations in the frequency of the signal beam with respect to the frequency of the reference beam, the undesired frequency variations of the signal beam being caused by acousto-optic modulation whose primary purpose was only to amplitude-modulate the signal beam. Upon readout, the output light beam, which has been produced in the prior art by directing a laser readout beam onto the holograms, has exhibited an undesirable motion because of geometric effects introduced by the rotating polygonal mirror as it scans the readout light beam across the film. Small variations in the thickness of the film on which the holograms were recorded, within the width of a single hologram, have resulted in erratic variations in location of the output beam because of prismatic deflections of the readout beam as it passed through the film. Also in the prior art, non-planar acoustic waves in acousto-optic data modulators have distorted the modulated beams.

SUMMARY OF THE INVENTION

The present invention is an information storage system in which data are stored in a spatially distributed form on a record member, for example, a photographic film, from which the information can be read out by a scanning light beam. High information rates are achievable.

In order to scan the light beam across the record member during readout of data, a light beam is directed along a first segment of a light path to a first rotating light deflection device, for example, a rotating mirror, so that a second segment of the beam, produced by reflection from the mirror, scans the record member. The second segment of the beam is in motion. Where the light beam encounters the record member during readout, the beam is modulated by data stored on the record. In one aspect of the invention a third segment of the beam following modulation by the record, is directed to a second rotating deflection device, for example, to a second rotating mirror, to produce, after a second deflection, a fourth segment of the readout beam. When the first and second rotating deflection devices are properly synchronized and symmetrically arranged geometrically, for example, when they both are facets of a rotating polygonal mirror, the fourth segment of the readout beam, which contains the desired modulation, does not rotate, the direction rotation caused by the first deflection having been eliminated by the second deflection.

The readout light beam, which scans the spatially distributed record, suffers an undesirable deflection in passing through a transparent photographic film on which the record is spatially distributed, because variations in the thickness of the film across the transverse width of the readout light beam result in prismatic deflection of the beam. The prismatic deflection is detected and the direction of the readout light beam is steered so as to compensate for the deflections arising from these variations in film thickness.

Another aspect of the invention involves the recording of data in the form of holograms. Interference fringes of a hologram which is being recorded move about as a result of incidental frequency shift of a signal beam incurred in the process of modulating the signal beam with an acousto-optic device. In the present invention, a reference beam, which is provided for forming the hologram by interference with the signal beam, is similarly frequency modulated, to substantially eliminate variations in relative frequency between the signal and reference light beams; this substantially prevents the aforedescribed motion of the hologram fringe pattern.

An additional feature of the invention is that dead time between recording of successive rows of holograms is substantially reduced. Dead time occurring when the scanning function is being transferred from one facet of a polygonal scanning mirror to the next facet, is substantially reduced by optically establishing a great enough width of the light beam which impinges upon the polygonal scanning mirror to illuminate two facets of the polygonal mirror simultaneously.

In yet another of its aspects, the invention includes self-synchronization of clocking pulses for gating of output data derived from the record upon readout. The spatially distributed successive data records, for example adjacent holograms on the record bearing member, are spaced apart by unmodulated guard spaces. When the readout beam is scanned from one record area across a guard space to the next record area, the resulting modulation of the output light beam is detected and employed to synchronize the output gating of data read from successive data records.

Another aspect of the invention is the use of a plurality of optical fibers for conducting light from each of the cross-sectional portions of the output light beam to a respective light-sensitive detector, so that the light-sensitive detectors can be spaced farther apart than the corresponding portions of the light beam, and electrical crosstalk between channels is reduced.

Crosstalk between different data channels, which correspond to different cross-sectional portions of a recording light beam, is reduced by acoustically exciting adjacent ones of the light modulation channels with carrier signals that are in time quadrature.

A further aspect of the invention is to provide optical correction means for compensating a light beam for defocusing of the beam incurred as a result of diffracting the beam with acoustic waves having non-planar wave fronts.

LIST OF FIGURES

Further aspects and features of the present invention will be apparent from the following detailed description thereof with reference to the accompanying drawings in which:

FIG. 1A is a top view schematic diagram of a preferred emodiment of the information storage system.

FIG. 1B is a fragmentary side view schematic diagram of the system of FIG. 1A.

FIG. 2A shows a portion of an acousto-optic block data composer for modulating a plurality of light channels.

FIG. 2B is a side view of the composer of FIG. 2A.

FIG. 4 is a beam cross-section diagram at an input to a polygonal beam scanner.

FIG. 5 shows the geometry of a light beam and scanning mirror for achieving a high duty cycle while scanning.

DESCRIPTION OF A PREFERRED EMBODIMENT

Figure 2C:
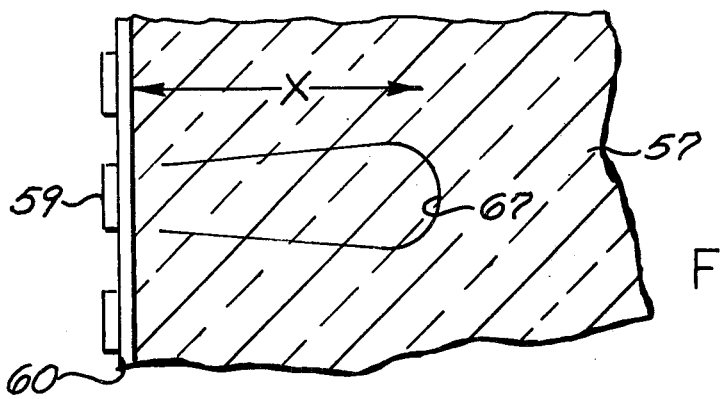
FIG. 2C shows an acoustic wave in the composer.

In a preferred embodiment of the invention, Fourier holograms are recorded on film in rapid succession for later readout, each Fourier hologram containing 128 bits of data. The system comprises an acousto-optic block data composer that modulates a light beam simultaneously with 128 data bits, an optical system for producing a succession of holograms each of which includes 128 data bits, an addressing system including a spinning polygonal scanning mirror for recording and reading successive holograms at different locations on a film, and a detector array system for reading out simultaneously the 128 data bits of each hologram. If it is desired that the input and output data be in the form of serial data streams, the system also includes an input demultiplexer for grouping the serial input data into 128 bit parallel groups, and an output multiplexer for multiplexing the output data from the 128 bit groups into a serial output data stream.

As shown in FIG. 1A, a 200 milliwatt continuous wave argon laser light source 10 produces a beam of coherent 5145 Angstrom light which enters an acousto-optic gating modulator 11 that serves as a shutter for passing 80 nanosecond light pulses. The pulses go to a beam-forming optics module 12 in which they pass through a lens 16 and enter an acousto-optic modulator 18 that serves as a beam splitter, as shown in FIG. 1A. The beam splitter 18 is hard flint glass with a lithium niobate transducer material on one of its faces. An electrode is deposited on the exposed surface of the transducer material to produce an acousto-optic transducer which is excited by 110 MHz electrical signals that are envelope-modulated by square wave pulses.

A portion of the laser light beam entering the modulator 18 passes straight through the modulator and another portion is deflected because of interaction with an acoustic grating produced therein by the transducer at a Bragg angle with the optical axis. In this way, the acousto-optic beam splitter 18 divides the laser output beam into a 160 milliwatt signal beam and a 20 milliwatt reference beam 20 for later producing a hologram. The efficiency of the reference beam channel is much higher than that of the signal beam channel, so that the reference beam intensity is many times greater than the signal beam intensity at the subsequently produced hologram.

The deflected reference portion 20 of the laser beam is shifted in frequency by 110 MHz by the modulator 18, FIGS. 1A, 1B. The deflected reference beam 20 is redirected by a mirror 22 to a second deflecting mirror 24 and then passes through a lens 26 and an adjustable aperture plate 28, which are used for Fourier filtering. The reference beam is apodized for writing and reading, to improve the contrast ratio by preventing side lobes from contributing significant amounts of false bit energy during readout by interrogating unaddressed holograms on the same scan line as the addressed hologram. The reference beam than passes through other lenses 30, 32 and is deflected from a mirror 34 and from another mirror 36, after which it exits from the beam-forming optics module 12 as beam 52, FIG. 1B.

The undeflected component 38 from the acoustic beam splitter 18 is further conditioned and employed as a signal beam for forming holograms. The component 38 is reflected from the mirror 22, FIG. 1A, to a mirror 40 and then through a lens 42 and an aperture plate 44, which form a spatial filter located at the common focal point of two lenses. The signal beam then passes through a lens 46 and another lens 48, and comes out of the beam-forming optics module 12 as a wide uniform collimated line light beam 50, FIGS. 1A and 1B. The lenses that form the beam 50 are a conventional beam expanding telescope arrangement which form a coherent optical plane wave with which to illuminate a multi-channel modulator, i.e. block data composer, 56.

The wide signal beam 50, which is only 100 microns thick, is incident upon the block data composer 56 where it is modulated by data. The composer 56 is an acousto-optic modulator as shown in FIGS. 2A and 2B in which 128 different lineally arranged portions of the wide beam 50 are simultaneously modulated by 128 bits of data.

The acousto-optic modulator 56 involves a well-known principle in which acoustic strain waves cause small perturbations in the refractive index of an acousto-optic medium. The periodic structure of the refractive index variations enhances the scattering of light selectively along particular directions, the light scattering being similar to diffraction by a phase grating. In the case of the Bragg type of diffraction that is used in the preferred embodiment of the present apparatus, the length of the acousto-optic interaction region and the geometry can be arranged such that the interaction favors only one of the two lowest diffraction orders. High diffraction efficiency can be achieved for the first-order diffracted light.

The modulator 56 is a block 57 of optical glass having 128 transducers 63 on one of its surfaces 60 which, when electrically energized, produce a plurality of acoustic waves 62 travelling into the glass 57. In the glass, each of the acoustic waves crosses the optical path of one of 128 different beam portions 58 of the beam 50.

In the preferred embodiment SF-8 dense flint glass is employed as the acousto-optic material 57 of the block data composer 56. A single 20 × 20 millimeter LiNbO₃ transducer 61 is bonded to a single block of the glass. An electrode pattern 59 defining active transducer material to form 128 independent transducers 63. Each active transducer strip is 9 mm long and only 0.15 mm wide. A diffraction efficiency of 30% is typical for the modulator 56. The plane in which the electrode pattern 59 is deposited is in a vertical position in FIG. 1A.

Acoustic excitation of 110 MHz carrier frequency, envelope-modulated in accordance with data pulses, is employed for the block data composer 56. In the present embodiment the presence of an RF pulse at an acoustic channel indicates a logic 1, that is an ON bit, and the absence of an RF pulse indicates a logic 0, that is an OFF bit. 128 bits of data are entered in parallel into the acoustic modulator during one envelope pulse interval of the acoustic excitation waves 62.

When the acoustic waves are in the aperture, the laser beam is gated on by the acoustic modulator gate 11 located immediately following the laser 10. The acoustic grid produced in each light data channel by its respective acoustic wave 62 interacts with the light being transmitted through that channel by Bragg diffraction to deflect the beam if a data 1 is present, as represented by a pulse of the 110 MHz signal, and to leave the beam undeflected in the case of a data 0, corresponding to absence of excitation.

The input light 50 to the acousto-optic modulator 56 enters the modulator at an angle such as to be deflected off the back of the acoustic wave 62 in the modulator so that the frequency of the deflected light is shifted downward. The light 50 wave strikes the back of the acoustic wave at a relatively shallow angle, for example, an angle on the order of 1°, although the angle is shown greatly exaggerated in FIG. 2B. The deflection angle between the incoming wave 50 and a deflected outgoing wave 58 expressed in radians is approximately equal to the ratio of the wave length $L_L$ of light to the wave length $L_A$ of the acoustic wave in the glass 57.

Thus, in the absence of an acoustic wave, a portion of the light beam 50 passes through the acousto-optic medium 57 without deflection and is later blocked by a spatial filter 96; no light reaches a film 108 on which a hologram is to be recorded, under such a condition. To modulate one of the fractional light beams 58 with a logic 1 signal, an acoustic wave is applied and a portion of the light is deflected into and through the window of the spatial filter 96, so that it appears on the film 108.

The useful portion of output of the signal beam modulator 56 is a linear array of 128 data-modulated beams 58 as shown in FIG. 2C. The useful bandwidth of each data modulation channel 58 is 40 MHz, the limit being imposed by Bragg diffraction matching between the acoustic and optical waves. Alternate ones of the 128 light beams 58 are modulated by RF signals in phase quadrature in order to minimize crosstalk between adjacent channels. The quadrature phase relationships are accomplished by RF phase delay devices 65, FIG. 3.

Figure 2D:
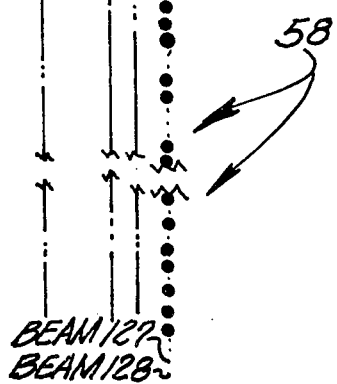
FIG. 2D is a cross-sectional view of a plurality of deflected light beams at an output of the block data composer.

To reduce the intensity of the central part of the Fourier transform light distribution at the film 108, the RF data signal pulses were also bi-phase modulated from bit to bit across the data array of FIG. 2D, in a pseudo-random sequence that also conformed to the quadrature requirement for adjacent channels. In progressing across the 128 channels, the RF phase of each channel is either 90° or 270° out of phase with the preceding channel, the choice between 90° and 270° being made in a statistically random manner, for example by coin toss or from a table of random numbers.

Each transducer 63 of the block data composer 56 is very long and narrow and acts as a line source of the acoustic waves 62. The acoustic wave 62 within the glass 57 from one transducer 63 is approximately a planar wave at points very close to the transducer. At greater distances into the glass the acoustic wave 62 no longer has a planar wave front; instead, an equi-phase contour of the wave, as viewed in a plane perpendicular to the long dimension of the transducer, is curved. The acoustic wave front is a very long curvaceous cylinder.

The curved shape of the acoustic wave front results in defocusing of the signal light beams 50 that are deflected by Bragg diffraction in the modulator 56. The light 58 can be refocused externally, however, by an optical system employing a cylindrical lens that is arranged to substantially correct the defocusing that occurred in the acousto-optic modulator 56. Thus, the original focused condition is substantially recoverable by reversing the acoustic defocusing process with optical lenses. This optical correction of acoustic defocusing is possible because the acoustic waves 62 are coherent and the light 58 is coherent. In the preferred embodiment the optical path length required for the subsequent refocusing is substantially greater than the optical path length within the glass 57 in which the distortion occurs. Preferably the optical correction is performed following the acoustic defocusing, although other arrangements of the elements involved are possible.

To compensate optically for defocusing deflection from an acoustic wave, a cylindrical lens of focal length F is placed at a distance 2F from the center region 65 of the acousto-optic modulator, where $F = (XL_A)/(4L_L)$. X is the distance into the glass from the transducer the region 65 of interaction between acoustic and light waves, as shown in FIG. 2B and 2C. The cylindrical lens 90 is oriented so as to have a focusing action in the plane A of both the acoustic and optical wave propagation directions, as in FIGS. 1A and 1B. The lens 90 does not perform any focusing function in the orthogonal direction of FIG. 1B. In a side view such as in FIG. 1B, the image of data bits comes to focus at a distance 4F from the center 65 of the modulator 56 because of cylindrical curvature 67 of the acoustic wave 62, FIG. 2C. With the lens 90 in place, a bit pattern image comes to focus in both of the orthogonal directions, at a distance 4F from the center 65 of the acousto-optic modulator 56. In the particular embodiment being described herein as an example, the distance X is typically 1.5 mm, $L_A$ is 30 microns, and $L_L$ is about 0.51 microns.

Data for modulating the signal beams 58 comes into the block data composer 56 from a demultiplexer subsystem 66, FIG. 1A. The function of the demultiplexer 66 is to accept serial binary input data at an input terminal 68 and to produce 128 bit blocks of parallel output data at electrical output conductors 70 of the demultiplexer 66. The output data at the conductors 70 are in the form of 110 MHz carrier signals that are amplitude-modulated by unipolar square waves in accordance with the binary data.

Figure 3:
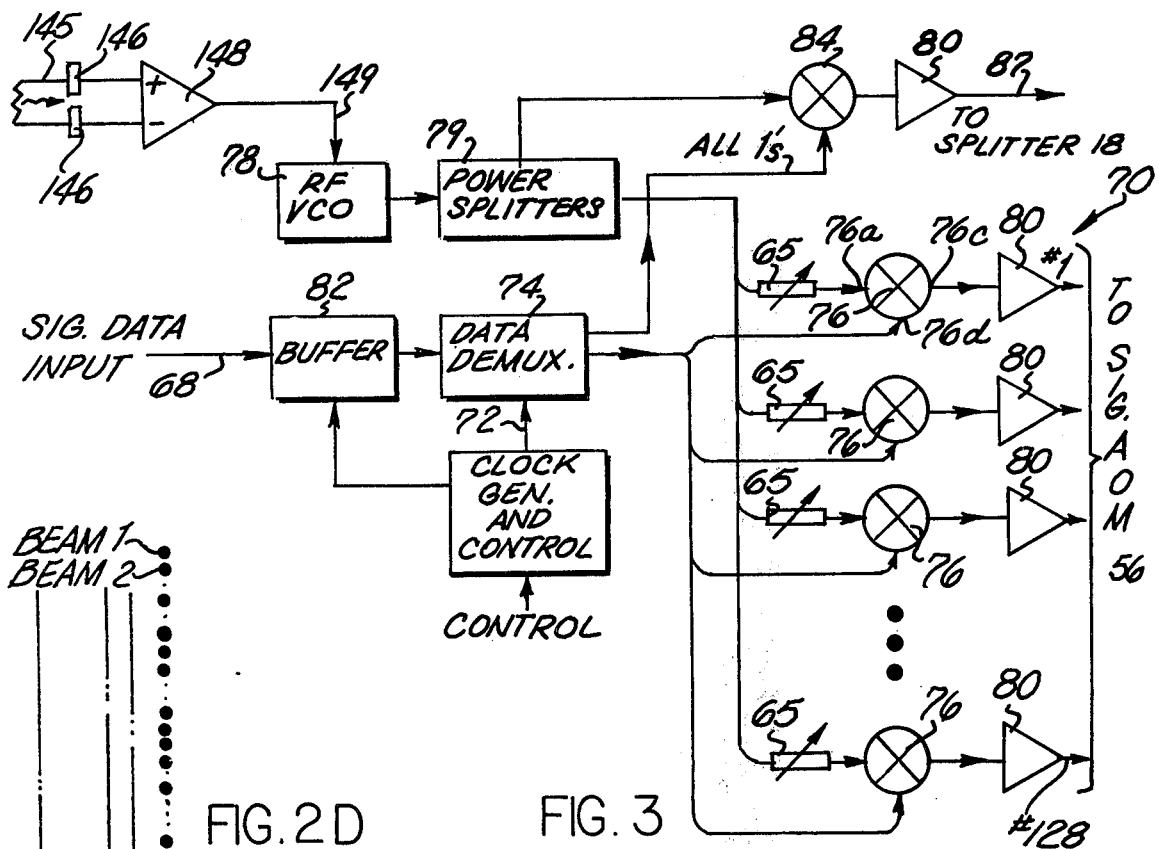
FIG. 3 shows excitation apparatus for modulating the signal beam and the reference beam of the holographic recorder.

The demultiplexer 66 also contains a buffer register 82 for storing data received between the times of recording rows of holograms, as will be described in more detail hereinafter. A block diagram of a suitable demultiplexer 66 is shown in FIG. 3. The serial input data at the input terminal 68 and a synchronizing signal on a conductor 72 enter a data demultiplexing circuit 74 from which 128 channels of parallel output data flow to 128 data modulators 76.

An oscillator 78 produces a nominally 110 MHz carrier signal whose power is divided by conventional power splitters 79 to provide 110 MHz CW carrier power through the quadrature phase shifters 65 to a terminal 76a of each of the balanced double-diode envelope modulators 76. The modulators 76 are well-known passive devices of the prior art that are sometimes called double balanced mixers, which function as follows. Each modulator 76 has a 110 MHz signal at its output terminal 76c when a logic 1 signal is present on its data terminal 76b, and has a negligible output signal at the output terminal 76c when a logic 0 data signal is present at the data terminal 76b.

The output signals of the modulators 76 are strengthened by amplifiers 80 whose output signals are conducted on the conductors 70 to the transducers 63 of the block data composer 56, as was described above. Sufficient buffering (32 bits per channel) is provided in the demultiplexer subsystem 66 to bridge over a small recording dead time between hologram rows and to absorb small fluctuations in the rate of receiving serial data at terminal 68. If preferred, that data buffering function of buffer 82 could instead be performed at a data place in the circuit.

The demultiplexer subsystem 66 further includes a 110 MHz signal circuit obtained from the power splitter 79 and modulated by a stream of all 1s in a balanced diode modulator 84. The output signal of the modulator 84 connects to a broadband power amplifier 86 having an output power capability of several watts. This provides an excitation signal for the combination beam splitter and reference beam frequency modulator 18 described above, on a conductor 87. The reference beam 20 is both frequency modulated and amplitude modulated with all 1's by the modulator 18. Because the modulation of reference beam 20 by the modulator 18 is performed by a portion of the output power of the carrier source 78 that is used also to modulate the signal beam 50, the relative frequency modulation between the signal and reference beams is zero; this prevents undesirable motion of the fringe pattern of the hologram which is to be produced.

All of the 128 signal beams 58 that leave the modulator 56 at different locations are ultimately interfered simultaneously with the reference beam 52 at a common Fourier transform plane to produce a hologram 109. All 128 bits of one data block therefore occupy the same area on one hologram. Each of the 128 data channels is represented by a different spatial frequency of fringes on the hologram 109 as is well-known in the art.

The reference beam 52 is offset transversely from the signal beam 58 by an unoccupied space approximately equal to the width of the 128 bit array of signal beams 58 at the output of the block data composer 56. The signal beams 58 that propagate out of the modulator 56, and the reference beam 52, all pass through an anamorphic optical system consisting of the compound cylindrical and spherical lens 92, which produces beams having a Fourier transform plane 94, and a spatial slit filter 96 which is located at the Fourier transform plane 94, FIGS. 1A 1B. The spatial filter 96 is a precision slit that shapes the signal and reference beams, spatially filters them, and assures the coincidence of the two beams. Because the reference beam 52 and all of the component signal beams 58 are present in the same cross-sectional area at the plane 94, that plane contains a single hologram of the Fourier transform of all of the signal beams 58, superimposed. Holograms are not recorded in the plane 94 because each successively produced hologram must first be addressed to a particular unique location on the recording film 108.

The signal and reference beams are brought to focus at the Fourier spatial filter plane 94; they are again brought to focus at the film 108 after being deflected by an addressing system scanner 104 to an appropriate position on the film 108. A spherical collimating lens 98 follows the spatial filter 96 on the beam path, and it transmits a collimated signal beam 100 and reference beam 102 to the rotating scanner 104. FIG. 4 shows a cross-section of the beams 100 and 102, which are line sources, as they exist at a plane 5—5 of FIG. 5. At that plane the beams are seen to have been inversely transformed to a horizontally spread image of an array of data bits. The scanner 104 has 40 uniformly spaced vertical mirrors, each 9° wide; its function is to distribute successive holograms transversely, i.e. in a horizontal direction hereafter referred to as an X-coordinate direction, onto the recording film 108 after they have passed through another lens 106. In the preferred embodiment the scanner 104 is about 76 mm diameter and has an axial height of about 13 millimeters. Two motors 105 are on its shaft for recording and synchronous readout.

The lens 106 is a transform lens that brings the light which it receives to a focus in the plane at which the film 108 is located, which is another Fourier transform plane. This produces a Fourier transform of the binary data pattern of the block data composer 56, which is interfered at the film plane with the reference beam to produce a Fourier hologram there. The film is preferably a fast type such as AGFA 10E56 or an equivalent. While each mirror facet of the spinning scanner 104 is being used for recording, 1536 different holograms are recorded side-by-side horizontally across the film 108.

At the polygonal scanner 104, the beams 100, 102 are each wide enough to cover simultaneously two mirrow facets 104a, 104b of the scanner, as shown in FIG. 5. When one of the facets 104a of the spinning scanner 104 has finished recording its 1536 holograms in a row, and is therefore just beginning to move out of the beams 100, 102, and adjacent facet 104b of the spinner has just become fully illuminated by the beams 100, 102, and is ready to record its first hologram of the next row. Whenever a facet is being used for recording it is fully illuminated.

Although with this recording geometry, holograms could theoretically be continuously recorded at a fixed clock rate with 100% duty cycle, i.e. with no dead time between the end of one row of holograms on the film and the beginning of another row, this is not done in the preferred embodiment. A small dead time i.e. inactive period, is deliberately created between adjacent rows of holograms to obviate having to construct the spinner with a very high degree of accuracy of the relative angular positions of the facets. Input data are stored in the buffers 82 of the demultiplexer and buffer unit 66 during the dead time, and the recording system is operated at a slightly higher recording rate during the recording periods, to empty the buffers.

The facet 104a is shown in FIG. 5 as producing a hologram at an extreme location 113 on the film 108, while the facet 104b is shown ready to produce a hologram at a masked location 112, which is the first omitted hologram location, at the opposite extreme side of the film 108. Thus, each facet is fully illuminated throughout its recording interval, and when fully illuminated, it intersects only about 50% of the horizontal width of the input beams.

Figure 6A:
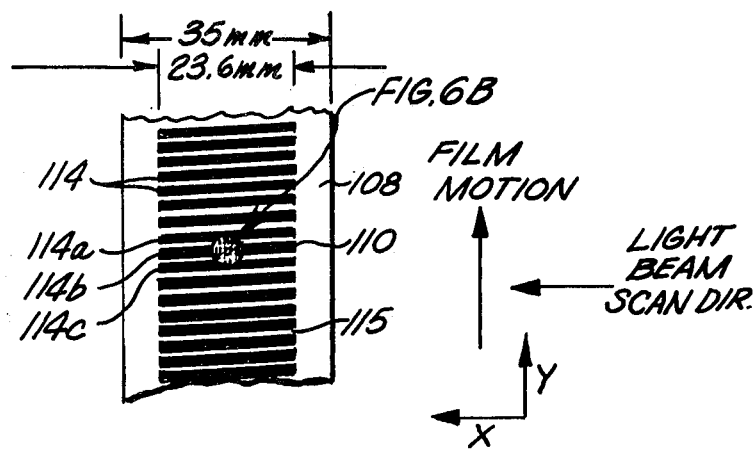
FIGS. 6A, 6B and 6C show the arrangement of Fourier holograms on a film record.
Figure 6B:
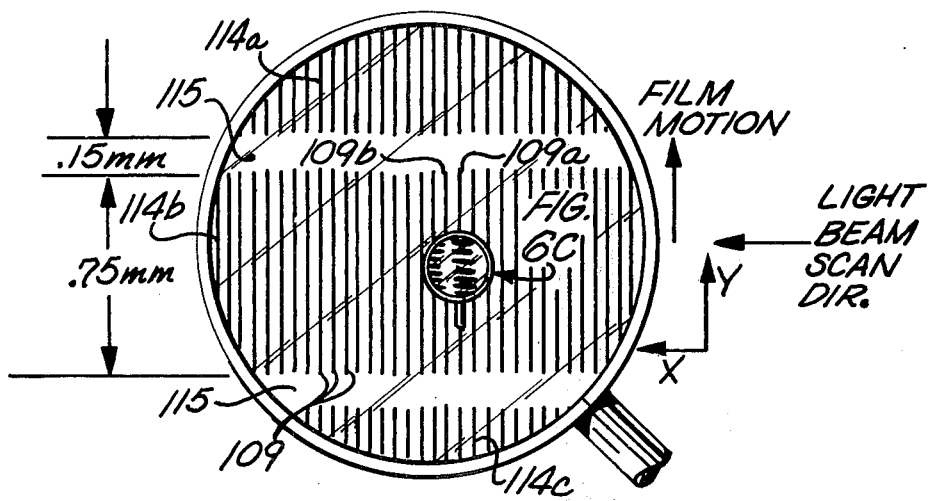
Figure 6C:
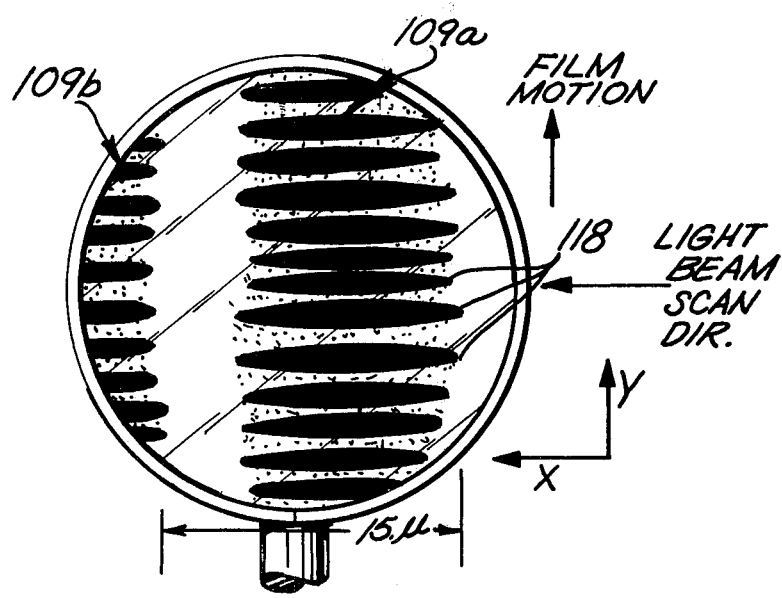

Each Fourier hologram is a record of 128 bits of data, with each of the 128 bits spread throughout the entire area of the hologram to reduce errors due to scratches and dust. Successive holograms are recorded in adjacent horizontal positions on the film 108 as shown in FIGS. 6A, 6B, and 6C. In the preferred embodiment, the film 108 is 35 mm wide, and is in 100 foot rolls. A section of the film is shown in FIG. 6A where each of the transverse rows 114 contains 1536 holograms.

FIG. 6B is an enlargement of one of the rows 114b and of portions of two other rows 114a and 114c. The guard bands 115 between rows of holograms are 150 microns wide in the Y-coordinate or vertical direction. In each of the rows 114 FIG. 6B shows a plurality of the holograms 109, each hologram being about 0.75 millimeters long in the Y-coordinate or longitudinal direction and 12 microns wide in the X-coordinate direction. The 12 micron width includes 2 microns of smearing due to scanner motion during the 80 nanosecond exposure time established by the light gate 11. The holograms are spaced 15 microns apart horizontally from center to center, which leaves a guard space between holograms of about 3 microns width to prevent degradation of the contrast ratio.

A further enlargement is shown in FIG. 6C where one hologram 109a and a portion of another hologram 109b are shown. Interference fringes 118 of the holograms 109a and 109b are visible in FIG. 6C.

In a time sequence of recording operation, the scanner 104 scans the light beam transversely across the film 108 by means of the facet 104a to produce in rapid succession the holograms 109 of one row 114a. At the left-hand end 113 of that row, FIG. 6A, the second facet 104b of the spinner comes into use for recording purposes, and it records the first hologram at the right-hand side 111 of the next following row 114b on the film 108.

As the scanner 104 rotates through the 9° angular span of any one facet, the light incident upon the lens 106 is scanned through 18°, and the focused light on the film 108 is scanned across 23.6 millimeters in the X direction. As a spinner facet 104a rotates it also translates around the circumference of the spinner 104, thereby creating a virtual pivot axis 117 for rays of the reflected light bundles, that is located inside the polygonal spinner 104, FIG. 5. The scan lens 106 is positioned such that its front focus coincides with the virtual pivot axis 117, in order to keep the principal pupil ray normal to the surface of the film during scanning, i.e. to provide a telecentric scanning geometry.

For example, the reference beam comes up to the film 108 at an angle of about 9° below the horizontal, but in the X coordinate, that is, in the scan direction, the reference beam is telecentric.

The film 108 is maintained in continuous longitudinal motion by a film transport mechanism 120 of a type that employs conventional design techniques. The film transport mechanism 120 includes a conventional electronic control system that controls the tension of the film 108, that controls the film transport rate during recording by sensing register marks on the film, and that controls the film transpsort rate during readout by sensing of hologram rows and by phase locking.

On synchronizing phase lock servomechanism that is provided involves a pulse signal that is produced when one facet points to the beginning of the scan line on the film. Another phase lock servomechanism is a digital phase lock system for maintaining the clock frequency in speed synchronism with the scanner, the clock frequency being used for exposure and film transport timing control.

The spinner 104 has a facet position sensor that produces the synchronizing pulse signal for the beginning of a scan line at a different particular angular position of the spinner for every facet. The first hologram 109 of a row 114 is recorded when the control logic system receives a position-indicating signal from the facet position sensor of the spinner, and holograms are counted by a counter as they are successively recorded across the film in a row. When the hologram counter has a count of 1536, indicating that the last hologram on a row has been recorded, data are no longer clocked out of the demultiplexer system 66 into the block data composer 56. The flow of this data resumes later when the synchronizing pulse that corresponds to the next spinner facet is received from the spinner's facet position sensor, that pulse initiating the recording of the next successive row of holograms.

During readout there exists a component of the output light beam in the reference beam position that has not been diffracted by the hologram 109. This component of output light is amplitude modulated during beam scanning as it is transmitted through successive holograms on the film. It is detected by a light sensor 164, and the electrical signal produced thereby is used as a timing aid, as will be further described hereinbelow.

An optical row sensor is provided for sensing the longitudinal position on the film of each row 114 of holograms during readout, to determine the Y-coordinate of the film's position. The film transport mechanism 120 and the spinner 104 are driven from a common clock and in synchronism with output signals from the optical row sensor. In the transverse direction, i.e. the X-coordinate, hologram detector channel 164 and its associated circuit provide position information, so that both coordinates of hologram position are known and are controlled.

Design of the servomechanism for longitudinally synchronizing the film transport mechanism 120 to the scanner 104 is within the ability of those who are skilled in the art, and details of the servomechanism design are therefore omitted from this description.

In the preferred embodiment, the record bearing member, i.e. the film 108, is developed after recording. When it is desired to retrieve the data from the holographic record, the developed film 108 is again positioned in the location at which it was recorded, and is read out. Readout may be at a different data rate than the rate of recording. For readout the reference beam may optionally be switched to a higher intensity with a switchable beam splitter such as a variable Jodon attenuator or an acousto-optic beam splitter if desired. The signal beam is disabled during readout by de-energizing the modulator 56. A readout reference beam is directed to the spinner 104 as before in order to scan the successive holograms of the film transversely, and the film is simultaneously transported longitudinally but much more slowly for scanning in a Y-coordinate direction. Because the holograms are recorded in Fourier transform format, the accuracy requirement of the Y-coordinate location of the readout beam on the film is considerably relaxed. Hologram positions with respect to the readout beam can vary by ±40 microns in the Y direction without significant effects on the reconstructed data.

After the reference beam is reflected from a facet such as fact 104a of the spinner 104, the scan lens 106 directs the beam onto the film 108 at the location of a hologram 109 that is to be read out. A beam segment 122 of the readout beam, which is the segment between the spinner 104 and the scanning lens 106, has both translational and rotational components of motion because of the spinner 104. A beam segment 123 between the scan lens 106 and the film 108 translates but does not rotate, in the preferred embodiment.

During readout, light passes through the film 108, and in so doing is modulated by the hologram 109 spatially with respect to the cross section of the light beam. The modulated readout beam passes through a lens 124 to a mirror 126 from which it is reflected to another mirror 128, and from there through two more lenses 130, 132 to another portion of the spinner 104 having a facet 104c, FIG. 1A. The facet, lens, and mirror system 104a, 106, 124, 126 is identical to the facet, lens, and mirror system 104c, 132, 130, 128. The moving facet 104c compensates for the motion of the beam segment 134 so as to produce a non-rotating segment 136 of output beam after reflection from the facet 104c.

The scan lens 106 and the lens 124, with their focal points coinciding, form a telescope, FIG. 1A. The lenses 124 and 130 also form a telescope, as do the lenses 130 and 132. Lens 132 has a virtual focus at an axis 133 inside the spinner 104. When the telescopes 106, 124, 130 and 132 are matched, and when locations of the optical components are adjusted for small error, the second reflection of the beam at the facet 104c compensates for the rotational component of motion of the beam segment 134. The telescopes are matched when (F1/F2) = (F4/F3), where F1, F2, F3 and F4 represent the focal lengths of lenses 106, 124, 130 and 132, respectively. The motion compensation occurs because of geometric symmetry of the first and second reflections at facets 104a and 104c, respectively. The axes 117 and 133 are located in symmetrical positions with regard to the positions of the facets 104a, 104c and the beam segments 100, 122, 134, 136.

Rotation can be seen to have been eliminated from the beam 136 by comparing the geometry of the reflections from the facets 104a and 104c. As the scanner turns, the beam 123 scans from position 112 to position 113 on the film 108, FIG. 5. If time were imagined to run backward, energy radiating from a "source" at location 113 would be reflected from the facet 104a to the beam 100, and the scanner would rotate counter-clockwise; after a time, the energy "source" would have moved to the location 112, and the facet 104a would have moved so as to continue to reflect a beam 100 parallel to that beam's previous direction. That is what happens in real forward-running time at the facet 104c. Energy radiates from a "source" at a location 104c and reflects from the facet 104c to produce an output beam 136; after a time, the energy "source" has moved to a location 112a and the facet 104c has turn clockwise so as to continue to reflect a beam 136 in a direction parallel to that beam's previous direction. Rotation has been eliminated from the beam 136, so that it can be focused. Beam 136 translates.

The second reflection of the beam, from spinner facet 104c, allows the bit pattern of the readout signal beam to be focused, and thus makes spatial noise filtering possible. The beam segment 136 passes through a lens 138 to a spatial filter 140. The readout beam continues through a transform lens 142, which is a compound cylindrical and sperical lens, to focus the 128 recovered bits of binary data as 128 amplitude modulated light beams 141 on a linear array of 128 optical fibers 143, about which more will be said hereinbelow.

Figure 7:
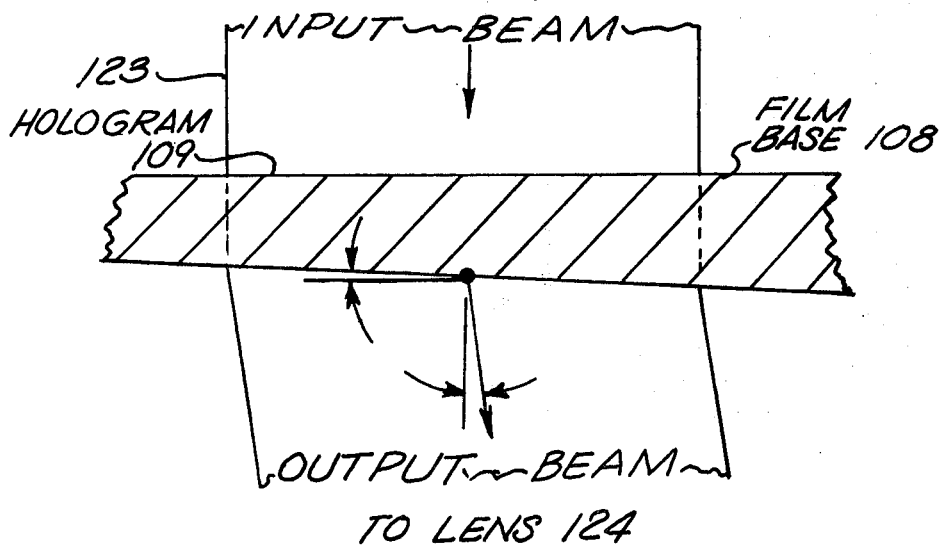
FIG. 7 illustrates prismatic deflection of a readout beam by the record film.

If the film 108 is not of uniform thickness across the Y dimension of the readout beam 123, the direction of propagation of the beam is changed slightly as the beam passes through the film 108. A film having tapered thickness therefore acts as a prism to deflect the readout beam, as shown in FIG. 7. Fingerprints on the film produce optical effects similar to the effects of non-uniform film thickness. A one micron optical thickness wedge over the double Rayleigh hologram length would create a shift of bit locations at the fibers 143 equal to the bit spacing, if not compensated. A beam direction servomechanism is employed to compensate for linear phase errors such as the linear component of these film thickness variations.

The prismatic effects of the film just described are corrected by steering the readout beam acousto-optically. A portion 145 of the output readout beam having no data, i.e. a portion of the reference beam that is amplitude modulated but not diffracted by the hologram 109, is sensed on a dual diode detector 146 which produces two output signals that are connected respectively to two inputs of a difference amplifier 148, FIG. 3. An output signal of the difference amplifier 148 on a conductor 149 is employed to control, during readout, the frequency of the voltage-controlled oscillator 78, whose output acoustically drives the beam splitter 18. When the readout beam is in a correct central position, the two diodes of the dual diode detector 146 receive equal illumination and the output signal of the difference amplifier 148 is zero. When the beam moves to an incorrect uncentered position in which the two diodes receive unequal illumination, the diode output signals are no longer equal and the difference amplifier 148 produces an output error signal at conductor 149 proportional to the difference, and whose sign depends upon the direction of the error of beam position. In response to the error signal of the voltage controlled oscillator 78 changes its output frequency. The beam splitter 18 thereupon deflects the reference beam 52 to a different angle at the output of the beam splitter 18. This change in beam angle changes the position of the readout beam enough to bring the image of the readout beam back substantially to the central position at which the two diode detectors 146 receive equal illumination. This action corrects the system for data position errors at the fiber optics array 143 arising from pismatic deflections of the readout beam by the film 108. The detector elements 146 are shown in position on FIG. 8.

Figure 8:
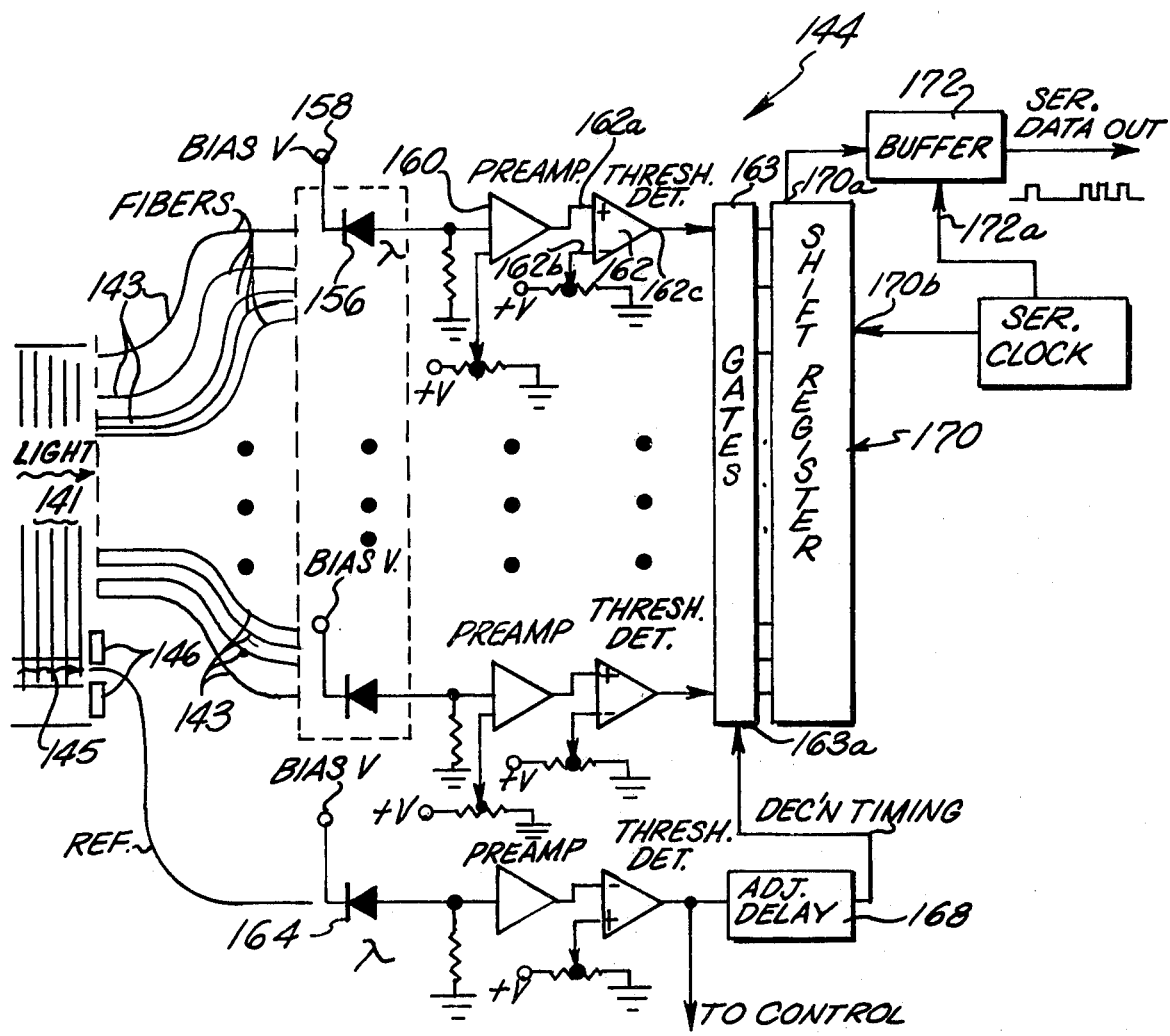
FIG. 8 shows a readout detection array in which optical fibers are used, and shows apparatus for self-synchronization of the clocking of output data, based upon beam modulation.

Electrical crosstalk between channels and electrical noise pickup are reduced by conducting the 128 modulated light signals and the reference beam signals through the optical fibers 143 as shown in FIG. 8 to an array of photosensitive detectors 156, 164, which are more widely spaced than the adjacent data channels of the output beams 141. The light input ends of the fibers 143 are located in a data image plane.

Electronic equipment 144 for processing the readout signals is shown in FIG. 8. Light from each of the 128 modulated beams is conducted by a respective optical fiber 143 and is directed onto a respective photodiode element. Apparatus associated with the first element 156 is typical of the 128 data channels. A positive 5 volt potential on a terminal 158 reverse-biases the diode 156 so that it serves as a high impedance current source whose current is proportional to the intensity of the light it receives. When the first photodiode 156 receives light, current flows through it from the bias terminal 158 to produce an input voltage at a preamplifier 160. An output signal of the preamplifier is applied to a non-inverting input terminal 162a of a differential amplifier 162, which is a threshold detector. An inverting terminal 162b of the amplifier 162 is provided with an adjustable threshold voltage. When the signal voltage at the non-inverting input terminal 162a exceeds the threshold voltage, the threshold detector 162 produces a positive output signal at a terminal 162c.

The readout electronic circuits 144 also include conventional DC restoring circuitry that is not shown.

The threshold detector 162 is followed by a gate circuit 163 that blocks the output signal of terminal 162c when a logic zero level is applied to a decision-timing terminal 163a, and which passes that output signal through to a shift register 170 when a logic 1 signal is applied to the terminal 163a. The functions of threshold detection and output gating could both be performed instead by a single commercially available semiconductor component. Conveniently, the readout circuits 144 may employ combined hybrid photodetector/preamplifier units on printed circuit cards. The photodetector diode array can be a conventional type, for example, the model PIN SA-100 manufactured by United Detector Technology.

A decision timing signal for application to the decision timing input terminal 163a is provided by a self-synchronized hologram detection channel employing a photodetector 164, FIG. 8. That channel detects the presence and absence of a hologram on the film 108 in the path of the reference beam as the scanner 104 scans the light beam 123 transversely across the film 108. The light intensity of the reference beam channel is different when the scanning beam is at a hologram 109 than when it is centered on a guard band 115 between holograms. A signal from the detector 164 is preamplified and applied to a threshold detector 166. The output of the threshold detector 166 of the reference beam channel passes through a phase delay device 168, whose output is employed to enable the gates 163 at the decision timing terminal 163a.

After the 128 data bits have been simultaneously entered in parallel into the shift register 170, they are read out serially from a serial data output terminal 170a. This is a multiplexing function which is performed by shifting the data contents of the shift register 170 in successive steps upon command pulses from a readout clock applied to a shift input terminal 170b.

An output buffer shift register 172 is provided that has a buffer clock input terminal 172a to receive shift pulses including pulses for shifting out the final bits of data while data from the next successive holograms are being read into the shift register 170.

A control system is provided for coordinating the various subsystems and for operator controls. In the interest of clarity, certain elementary and well-known control circuits of the preferred embodiment have not been described in detail because that is not necessary in order to describe the invention fully.

Amplitude tapering is provided in the optical system as a function of spatial coordinates transverse to the signal and reference beams, as in the prior art. A phase randomizing mask can also be employed as in the prior art to help to reduce the high central (dc) signal of the Fourier transform if desired.

The above-described compact memory system is capable of recording great amounts of data at extremely high data recording rates, and of reliably retrieving the data.

What is claimed is:

1. An information storage system comprising a light transmissive member on which a record of information is spatially distributed, means for directing a light beam onto said member, said member having a thickness longitudinally of said beam that varies across a transverse dimension of said beam so that said member prismatically deflects said beam upon transmission thereof, means for sensing said deflection including light sensistive means for detecting the position of the output beam after said prismatic deflection and for producing a position signal responsive to said output beam position, and means for receiving said light beam and responsive to said signal for compensatorily deflecting said beam to substantially correct for said prismatic deflection and maintain said output beam position constant at a place proximate said light sensitive means.

2. An information storage system as defined in claim 1 and further comprising scanning deflection means interposed to receive said light beam intermediate said source and said member for deflecting said beam to different portions of said spatially distributed record, said scanning deflection means including energizing means for varying the deflection for scanning said light bean across said record, and further comprising descanning deflection means for substantially eliminating scanning motion from said output beam.

3. An information storage system as defined in claim 2 and wherein said scanning and descanning deflection means comprise mirror means and said energizing means comprises means for rotating said mirror means to effect scanning of said record by said beam.

4. An information storage system as defined in claim 1 and wherein said light sensitive means for detecting the beam position comprises two light detection means each positioned for intercepting a different cross-sectional portion including an edge portion of said beam and each for producing a respective signal responsive to the amount of light received, said light sensitive means further comprising comparator means receiving said two signals and responsive to differences between said two signals to produce said signal responsive to said output beam position.

5. An information storage system as defined in claim 1 and wherein said means for compensatorily deflecting said beam comprises acousto-optic modulator means for deflecting said beam by different amounts in accordance with an acoustic excitation frequency, and acoustic excitation means for producing an acoustic frequency dependent upon said position signal for providing acoustic excitation of a corrective frequency to said compensatory deflecting means.

6. An information storage system as defined in claim 1 and wherein said record of information comprises a hologram.

7. A method for use in an information storage system having a light transmissive member on which a record of information is spatially distributed comprising the steps of transmitting a beam of light through said member, to detect prismatic deflection of the beam due to non-uniform thickness of the light transmissive member, sensing the position of the beam after said transmission and compensatorily deflecting said light beam in another light deflection means on said beam by the amount necessary to correct for the prismatic deflection and to maintain the beam position substantially constant where its position is sensed.

8. An information storage system comprising a signal beam, means for amplitude modulating and frequency modulating said signal beam, a reference beam, means for combining said signal and reference beams to produce a holographic interference pattern, and means for frequency modulating said reference beam to track the frequency modulation of said signal beam, whereby said interference pattern is stationary despite the frequency modulation of said signal beam.

9. An information storage system as defined in claim 8 and wherein said means for frequency modulating said reference beam comprises acousto-optic beam splitter means whose acousto-optically deflected beam provides said reference beam, and further comprises acoustic excitation means for modulating said acousto-optic modulator in response to said means for modulating said signal beam.

10. An information storage system as defined in claim 8 and wherein said means for amplitude modulating and frequency modulating said signal beam comprises first acousto-optic modulator means having an electro-acoustic wave transducer and further includes oscillator means for electrical excitation of said transducer of said first modulator and wherein said means for frequency modulating said reference beam comprises second acousto-optic modulator means having an electro-acoustic wave transducer and further comprises means for utilizing said oscillator means for electrical excitation of said transducer of said second acousto-optic modulator means.

11. A method for use in an information storage system having a signal beam and a reference beam comprising the steps of producing a hologram by interfering said signal beam with said reference beam, modulating said signal beam with at least frequency modulation, and modulating said reference beam with frequency modulation from a frequency source whose frequency tracks the frequency employed for modulating said signal beam, whereby the hologram is maintained in a stationary position.

12. An information storage system comprising a member bearing a spatially distributed record, said record having data areas modulated in accordance with data and unmodulated guard band areas therebetween having a different light characteristic than said data areas, meaans for producing an input light beam, means for scanning the input light beam across said spatially distributed record to produce an output light beam whose beam intensity varies in accordance with the spatial variations of said record so that said output beam has time intervals corresponding to data areas and time intervals of different beam intensity corresponding to guard band areas therebetween, first light sensitive means in the path of said output beam and responsive to said output beam to reproduce a data signal in accordance with said output beam to reproduce a data signal in acordance with said beam intensity, second light sensitive means receiving at least a component of said output beam for providing a timing signal when said beam has an intensity corresponding to one of either a guard band area or a data area, and gating means responsive to said timing signal for gating said data signal out of said first light sensitive means at a time in accordance with said timing signal.

13. An information storage system as defined in claim 12 and wherein said spatially distributed record comprises at least one hologram and said output beam includes a beam component that is undiffracted by said hologram and a beam component that is diffracted thereby, and wherein said second light sensitive means receives said undiffracted beam component for providing said timing signal.

14. A method for use in an information storage system having a member bearing a spatially distributed record in which the record has data areas modulated in accordance with data and unmodulated guard band areas therebetween having a different light characteristic than the data areas comprising the steps of scanning an input light beam across the spatially distributed record to produce an output light beam having diffracted and undiffracted components, the beam intensity of said output beam components varying in time intervals corresponding to data areas and guard band areas in accordance with spatial variations of said record; sensing the data modulation of at least one of said diffracted components of said output beam with a light sensitive detector to recover modulation data signals; sensing at least one of said components of the output beam with a second light sensitive detector and producing gate signals according to the light intensity thereof to indicate either a data area or a guard band area; and gating the modulation data signals to an output terminal under timing control of said gate signals.

15. An information storage system comprising a means for proividing a first information beam, a second information beam proximate said first information beam, first acousto-optic modulation means for acousto-optically modulating said first information beam, second acousto-optic modulation means for acousto-optically modulating said second information beam, first and second excitation circuit means for selectively energizing said first and second modulation means with first and second modulation signals respectively at a common frequency, and means for establishing a quadrature phase relationship between said first and second modulation signals, whereby crosstalk between said portions is reduced.

16. An information storage system as defined in claim 15 and wherein said first and second excitation circuit means comprise carrier source means used in common for energizing said first and second modulation means, and wherein said first and second acousto-optic modulation means comprise first and second acoustic transducer means associated respectively therewith for modulating said first and second respective information beams and wherein said first and second excitation circuit means comprise first and second respective transmission means for transmitting electrical power from said common carrier source means to each of said first and second transducer means, at least one of said transmission means including phase shift means for establishing said quadrature phase relationship between said first and second signals.

17. An information storage system as defined in claim 15 and wherein said first and second acousto-optic modulation means comprises respective modulation means for first and second adjacent channels of a block data composer.

18. A method for use in an information storage system having at least two adjacent information beams comprising the steps of passing first and second ones of said beams through first and second acousto-optic modulators respectively, energizing said first modulator with a first acoustic excitation signal to acousto-optically modulate said first beam, and energizing said second modulator with a second acoustic excitation signal of the same carrier frequency in quadrature phase relationship with said first excitation signal, whereby cross-talk between said beams is reduced.

19. An information storage system comprising a means for providing a light beam having a plurality of cross-sectional portions that are intensity modulated to correspond to respective information channels, a plurality of photosensitive means for detecting the intensity of respective portions of said beam, and a plurality of optical fiber means for conducting the light respectively from each of said portions to its respective photosensitive means, adjacent ones of said photosensitive means being spaced farther apart than adjacent ones of said portions of said beam, whereby crosstalk between said information channels is reduced.

20. An information storage system as defined in claim 19 and further comprising a hologram storing a plurality of information items corresponding respectively to said information channels, and means for reading out the information items including a coherent light beam directed to said hologram for producing said modulated light beam having a plurality of cross-sectional portions, each of said plurality of cross-sectional portions corresponding respectively to one of said plurality of information items of said hologram.

21. An information storage system comprising means for providing a coherent light beam, means for acousto-optically deflecting said beam including an acousto-optic wave transmission medium and acousto-optic transducer means for producing a non-planar coherent acoustic wave in said medium for deflecting said light beam, the light beam being defocused upon deflection by the non-planar wave front of said acoustic wave, and optical deflection means for substantially compensating for the acoustically produced distortion including means for optically deflecting different rays of said beam differently.

22. An information storage system as defined in claim 21 and wherein said transducer means comprises substantially a line source of substantially cylindrical acoustic waves propagating in said medium, and wherein said optical deflection means for substantially compensating the acoustically produced distortion comprises cylindrical lens means for substantially focusing said beam that was distorted by said substantially cylindrical acoustic waves.

23. An information storage system as defined in claim 22 and wherein said means for acousto-optically deflecting said beam comprises means for deflecting said beam by Bragg diffraction, and said cylindrical lens means comprises at least one lens external to said medium and at least one of whose optical surfaces is a cylinder whose straight lines are substantially perpendicular to a plane which includes the directions of propagation of both the acoustic wave and light waves of said means for acousto-optical deflection.

24. A method for use in an information storage system having a coherent light beam and an acousto-optic means including an acousto-optic transmission medium for deflecting the beam, comprising the steps of acoustically exciting the acousto-optic medium with a coherent acoustic wave having a curved wavefront, passing the coherent light beam through the medium for interaction with the curved acoustic wave to diffract the light beam, defocusing the light beam by means of the curved shape of the wave front of the acoustic wave during the diffractive interaction with the light wave, and optically deflecting the light outside of said acousto-optic medium so as to compensate the acoustically created distortion of the deflected light beam and enable focusing of said beam.

* * * * *